United States Patent
Chan

(10) Patent No.: US 7,065,684 B1
(45) Date of Patent: Jun. 20, 2006

(54) CIRCUITS AND METHODS FOR MEASURING SIGNAL PROPAGATION DELAYS ON INTEGRATED CIRCUITS

(75) Inventor: Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 460 days.

(21) Appl. No.: 10/126,201

(22) Filed: Apr. 18, 2002

(51) Int. Cl.
*G06K 5/04* (2006.01)

(52) U.S. Cl. ..................................... 714/700
(58) Field of Classification Search .............. 714/700, 714/704, 706, 707, 728, 724, 731, 733, 736; 324/763, 765, 158.1
See application file for complete search history.

(56) References Cited

U.S. PATENT DOCUMENTS

| | | |
|---|---|---|
| 3,603,746 A | 9/1971 | Helck |
| 3,843,938 A | 10/1974 | Bergman |
| 4,510,429 A | 4/1985 | Squire |
| 4,691,121 A | 9/1987 | Theus |
| 4,792,932 A | 12/1988 | Bowhers et al. |
| 4,795,964 A | 1/1989 | Mahant-Shetti et al. |
| 4,857,868 A | 8/1989 | Robb |
| 4,878,209 A | 10/1989 | Bassett et al. |
| 4,890,270 A | 12/1989 | Griffith |
| 5,048,064 A | 9/1991 | Rutherford |
| 5,083,299 A | 1/1992 | Schwanke et al. |
| 5,097,208 A | 3/1992 | Chiang |
| 5,181,191 A | 1/1993 | Farwell |
| RE34,363 E | 8/1993 | Freeman |
| 5,294,559 A | 3/1994 | Malhi |
| 5,351,211 A | 9/1994 | Higetta et al. |
| 5,422,585 A | 6/1995 | Fan Chiangi et al. |
| 5,581,738 A | 12/1996 | Dombrowski |
| 5,606,567 A * | 2/1997 | Agrawal et al. ............. 714/732 |
| 5,625,288 A | 4/1997 | Snyder et al. |
| 5,818,250 A | 10/1998 | Yeung et al. |
| 5,845,233 A | 12/1998 | Fishburn |
| 5,923,676 A | 7/1999 | Sunter et al. |
| 5,929,684 A | 7/1999 | Daniel |
| 5,973,976 A | 10/1999 | Sato |
| 6,057,691 A | 5/2000 | Kobayashi |
| 6,075,418 A | 6/2000 | Kingsley et al. |
| 6,134,191 A | 10/2000 | Alfke |

(Continued)

OTHER PUBLICATIONS

"The Programmable Logic Data Book", 1998, available from Xilinx, Inc. 2100 Logic Drive, San Jose, CA 95124, pp. 4-5 to 4-40.

(Continued)

*Primary Examiner*—Guy Lamarre
*Assistant Examiner*—James C. Kerveros
(74) *Attorney, Agent, or Firm*—Arthur Joseph Behiel; LeRoy D. Maunu

(57) ABSTRACT

Described are methods and circuits for precisely measuring signal propagation delays between synchronous memory elements. The memory elements are configured as a down counter that produces a test signal with a test period that is some multiple of a clock common to the memory elements. When the signal path is sufficiently fast for data to transfer between the synchronous memory elements in a single clock cycle, the test period is one multiple of the clock period. However, when the signal path fails to pass either rising or falling edges between the synchronous memory elements in a single clock cycle, the test period is increased by one clock period, and when the signal path fails to pass both rising and falling edges in a single clock cycle, the test period is increased by two clock periods.

15 Claims, 3 Drawing Sheets

U.S. PATENT DOCUMENTS 6,239,611 B1    5/2001    Matera
6,356,514 B1    3/2002    Wells et al.

OTHER PUBLICATIONS

Application Note from Xilinx, Inc., "Efficient Shift Registers, LFSR Counters, and Long Pseudo-Random Sequence Generators" by Peter Alfke, Jul. 7, 1996.

"Signal Delay in RC Tree Networks" IEEE Transactions on Computer-Aided Design, vol. CAD-2, No. 3, Jul. 1983, pp. 202-211.

"The Programmable Logic Data Book", 1999, available from Xilinx, Inc. 2100 Logic Drive, San Jose, CA 95124, pp. 3-3 to 3-22 and 4-3 to 4-69.

Prasanna Sundararajan, et al.; "Testing FPGA Devices Using JBits", 4th Annual Military and Aerospace Applications of Programmable Devices and Technologies Conference (MAPLD 01); presented Sep. 13, 2001; available from Xilinx, Inc., 2100 Logic Drive, San Jose, CA 95124; pp. 1-8.

* cited by examiner

CIRCUITS AND METHODS FOR MEASURING SIGNAL PROPAGATION DELAYS ON INTEGRATED CIRCUITS

FIELD OF THE INVENTION

This invention relates generally to methods and circuit configurations for measuring signal propagation delays through data paths of integrated circuits.

BACKGROUND

Integrated circuits (ICs) are the cornerstones of myriad computational systems, such as personal computers and communication networks. Purchasers of such systems have come to expect significant improvements in speed performance over time. The demand for speed encourages system designers to select ICs that boast superior speed performance. This leads IC manufactures to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Test procedures of the type described above are problematic for at least two reasons. First, many signal paths within a given IC are not directly accessible via input and output pins, and therefore cannot be measured directly. Second, testers have tolerances that can have a significant impact on some measurements, particularly when the path of interest is short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

The above-listed inventor and others at Xilinx, Inc., have identified methods and circuits that afford more precise measures of signal propagation delay, and that easily adapt for use with programmable logic devices (PLDs). For example, U.S. Pat. No. 6,075,418 to Kingsley, et al., entitled "System With Downstream Set or Clear for Measuring Signal Propagation Delays on Integrated Circuits," issued Jun. 13, 2000, describes methods of measuring signal-propagation delays on PLDs by including signal paths of interest in ring oscillators. The ring oscillators oscillate at frequencies that are a function of the delays through signal paths of interest. The oscillation frequencies of such oscillators are therefore indicative of the delays through various paths of interest. The above-referenced patent is incorporated herein by reference.

The methods described in the above-referenced patent work well. Nevertheless, there is always a need for still better approaches to analyzing speed performance, and some circuit configurations are more difficult to measure than others.

FIG. 2 (prior art) depicts a conventional synchronous circuit 200 used here to illustrate a common problem encountered when measuring speed performance on a PLD. Circuit 200 includes a pair of flip-flops 205 and 207 interconnected via some combinatorial logic 210 and a pair of nets 215 and 220.

Data present at the synchronous "D" input terminal of flip-flop 205 is latched into flip-flop 205 at the beginning of each clock cycle. On the same clock cycle, data presented on the synchronous "Q" output terminal of flip-flop 205 is latched into flip-flop 207. Input terminals are synchronous if they are activated by, and therefore synchronous with, a clock signal.

The maximum operating speed of circuit 200 is determined by the clock-to-Q delay of flip-flop 205, the delays associated with nets 215 and 220, the delay through combinatorial logic 210, the set-up time of flip-flop 207, and the clocks skew associated with clock line CLK. Determining the values of the aforementioned delays can be difficult and tedious. Measuring the set-up time of flip-flop 207 is particularly difficult. There is therefore a need for more precise methods and circuits for measuring the timing of critical synchronous paths on programmable logic devices.

SUMMARY

The present invention addresses the need for methods and circuits for precisely measuring signal propagation delays between synchronous memory elements on programmable logic devices. The synchronous memory elements are configured to instantiate a down counter that produces a test signal with a test period that is some multiple of a clock common to the synchronous memory elements.

When the signal path is sufficiently fast for data to transfer between the synchronous memory elements in a single clock cycle, the test period is one multiple (e.g., four) of the clock period. However, when the signal path fails to pass either rising or falling edges between the synchronous memory elements in a single clock cycle, the test period is increased by one clock period (e.g., to five clock periods), and when the signal path fails to pass both rising and falling edges in a single clock cycle, the test period is increased by two clock periods (e.g., to six clock periods). The ratio of the clock and test-signal periods (or frequencies) therefore provides an indication whether the test circuit works properly at a given clock frequency. One embodiment includes a variable-frequency test clock. The frequency of the test clock can then be varied to determine the frequency at which the data path fails to pass data.

This summary does not define the scope of the invention, which is instead defined by the claims.

DETAILED DESCRIPTION

Figure 1:
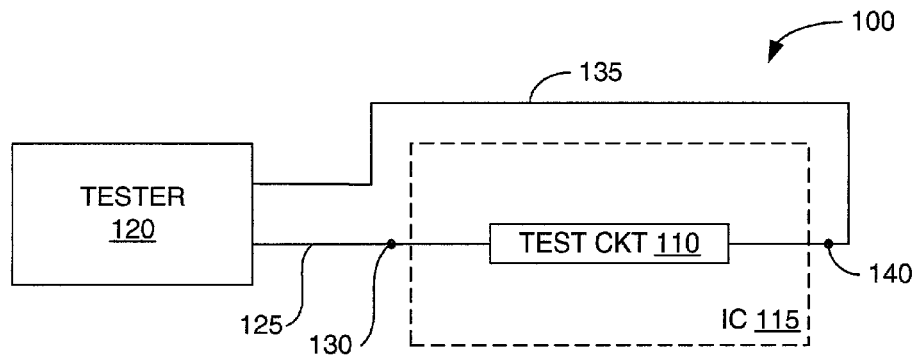
FIG. 1 (prior art) depicts a conventional test configuration 100 for determining the signal propagation delay of a test circuit 110 in a conventional IC 115.
Figure 2:
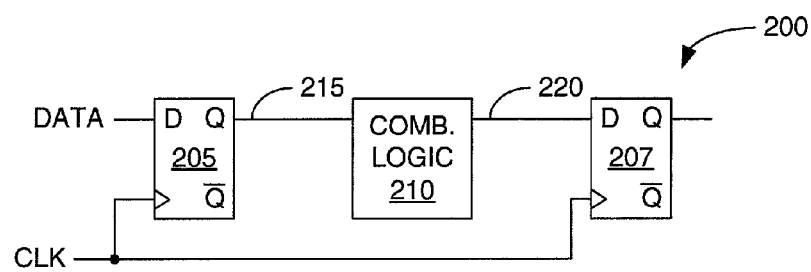
FIG. 2 (prior art) depicts a conventional synchronous circuit 200 used here to illustrate a common problem encountered when measuring speed performance on a PLD.
Figure 3:
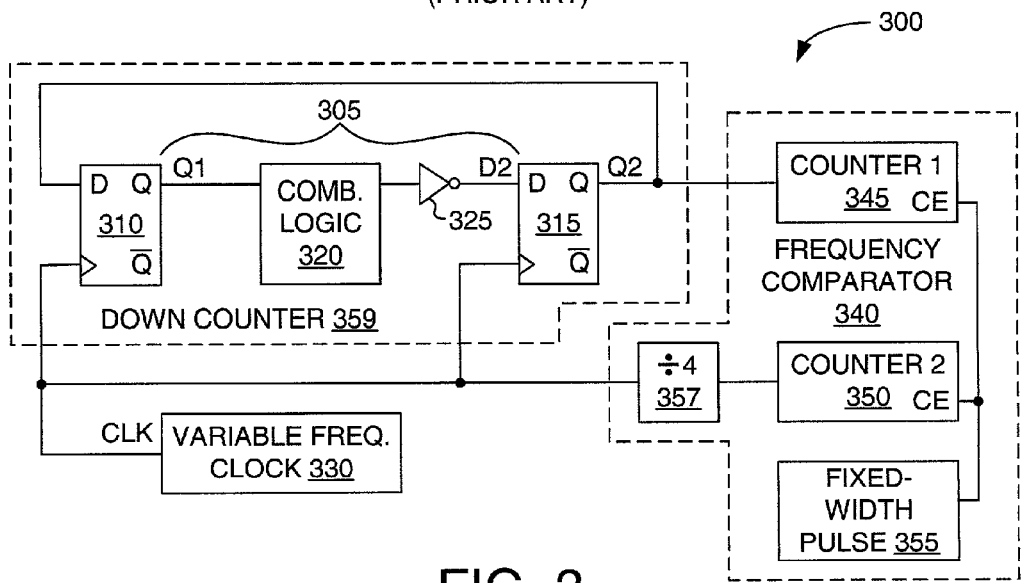
FIG. 3 depicts a test circuit 300 in accordance with one embodiment of the invention.

FIG. 3 depicts a test circuit 300 in accordance with one embodiment of the invention. Test circuit 300 facilitates precise measurements of a signal path 305 extending between a pair of synchronous elements 310 and 315. Signal path 305 includes some combinatorial logic 320 and an inverter 325. In embodiments in which test circuit 300 is instantiated in programmable logic on a PLD, combinatorial logic 320 may be a lookup table (LUT) programmed to implement a desired logic function.

A variable-frequency clock generator 330 and a frequency comparator 340 are included in circuit 300 to measure the delay through path 305. Frequency comparator 340 includes a pair of conventional counters 345 and 350, a fixed-width pulse generator 355, and a divide-by-four counter 357. Frequency comparator 340 is adapted to compare the frequency of the clock signal on line CLK with the frequency of the signal on output terminal Q2 of flip-flop 315.

Flip-flops 310 and 315 and the signal paths extending between them form a down counter 359. When signal path 305 is sufficiently fast for data present on the Q output of flip-flop 310 to reach and be latched into flip-flop 315 in a single clock cycle, down counter 359 is a divide-by-four counter. The signal on output terminal Q2 of flip-flop 315 thus has a period four times that of the clock signal on line CLK.

Figure 4A:
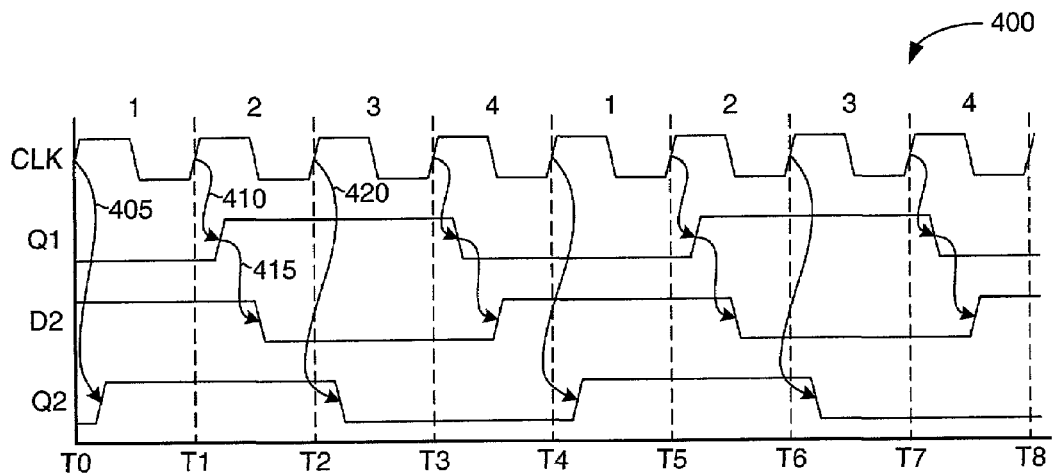
FIG. 4A is a timing diagram 400 depicting the operation of circuit 300 when signal path 305 of FIG. 3 is sufficiently fast so that data stored in flip-flop 310 is latched into flip-flop 315 in one clock cycle.

FIG. 4A is a timing diagram 400 depicting the operation of circuit 300 when signal path 305 of FIG. 3 is sufficiently fast so that data stored in flip-flop 310 is latched into flip-flop 315 in one clock cycle. The example of FIG. 4A assumes a starting point (time T0) at which the input node D2 of flip-flop 315 is high; consequently, output terminal Q2 of flip-flop 315 goes high just after time T0 (arrow 405). With output terminal Q2 high, the next rising clock edge causes output Q1 to go high (arrow 410), which in turn causes input terminal D2 to flip-flop 315 to transition low after the delay imposed by delay path 305 (arrow 415). Because input terminal D2 is low before the next rising clock edge, output Q2 will return low after the subsequent rising clock edge (arrow 420). The cycle of diagram 400 will thus continue for both rising and falling edges on output terminal Q2. The resulting signal on output terminal Q2 from flip-flop 315 will transition every two clock periods, and consequently exhibits a test period of four clock cycles. In other words, flip-flop 320, path 305, flip-flop 315, and the feedback path between flip-flops 315 and 310 divide the clock signal on line CLK by four and present the resulting signal to comparator 340.

Divide-by-four counter 357 likewise divides the clock signal on line CLK by four and presents the resulting signal to comparator 340. If circuit 300 is operating properly because signal path 305 is sufficiently fast for signals to transfer from the Q output of flip-flop 310 into flip-flop 315 in a single clock cycle, then the output signals from terminal Q2 and counter 357 will have the same frequency.

Fixed-width pulse generator 355 enables both counters 345 and 350 by asserting a logic one on their chip enable terminals CE, and then disables both counters simultaneously by de-asserting the chip enable signal. Assuming proper operation of the circuit, counters 345 and 350 will have identical counts. As we will see below, if path 305 is not sufficiently fast to transfer data between flip-flops 310 and 315 in one clock cycle, then the frequencies of the signals from output terminal Q2 and the output of counter 357 will differ. Frequency comparator 340 will indicate this disparity because the difference between the two frequencies will produce different counts in counters 345 and 350.

Figure 4B:
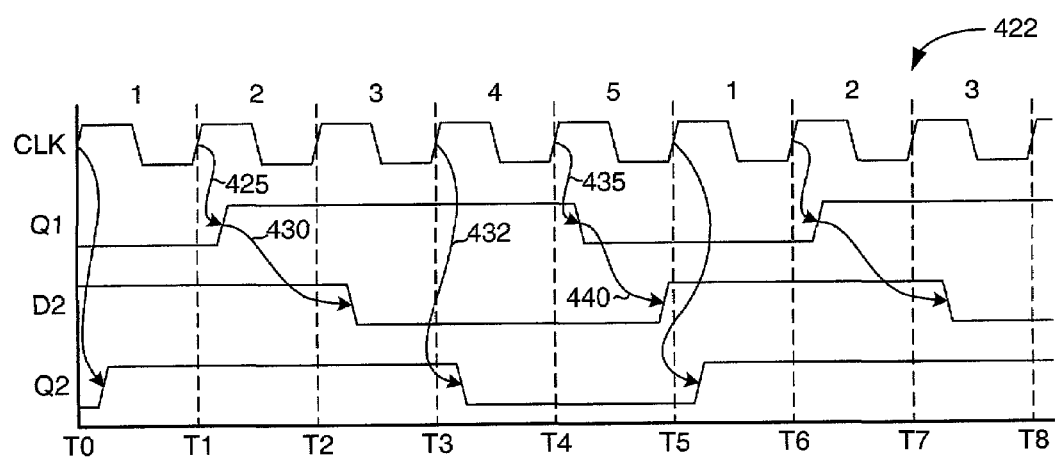
FIG. 4B is a timing diagram 422 describing the operation of circuit 300 of FIG. 3 when rising edges on output terminal Q1 of flip-flop 310 do not have sufficient time to latch into flip-flop 315 within one clock cycle.

FIG. 4B depicts a timing diagram 422 describing the operation of circuit 300 of FIG. 3 when rising edges on output terminal Q1 of flip-flop 310 do not have sufficient time to latch into flip-flop 315 within one clock cycle. Clock signal CLK goes high at time T1 causing output terminal Q1 to latch the logic one at output Q2 (arrow 425). The rising edge on output Q1 then traverses combinatorial logic 320 and inverter 325 (arrow 430). In this example the rising edge from terminal Q1 does not arrive at input terminal D2 before the subsequent rising clock edge at time T2. The falling edge on terminal D2 does not latch into flip-flop 315 until the rising clock edge at time T3 (arrow 432). The period of the output signal on terminal Q2 is therefore lengthened by one clock cycle.

At time T4, the rising clock edge latches the now low output on terminal Q2 into flip-flop 310 (arrow 435). In this example, falling edges traverse combinatorial logic 320 and inverter 325 faster than do rising edges. The rising edge resulting from the falling edge at terminal Q1 appears on terminal D2 before the next rising edge at time T5 (arrow 440). Thus falling edges on terminal Q1 do not increase the period of the signal on terminal Q2.

Fixed-width pulse generator 355 turns circuit 300 on for, e.g., 5,000 cycles. If circuit 300 continued to function as depicted in FIG. 4B, then counter 345 would have four counts for every five counts within counter 340. The ratio of counts between counter 345 and 350 can therefore be used to determine whether some signal transitions fail to traverse delay path 305 in a timely fashion, and can further be used to determine the number of such failed transmissions.

Figure 4C:
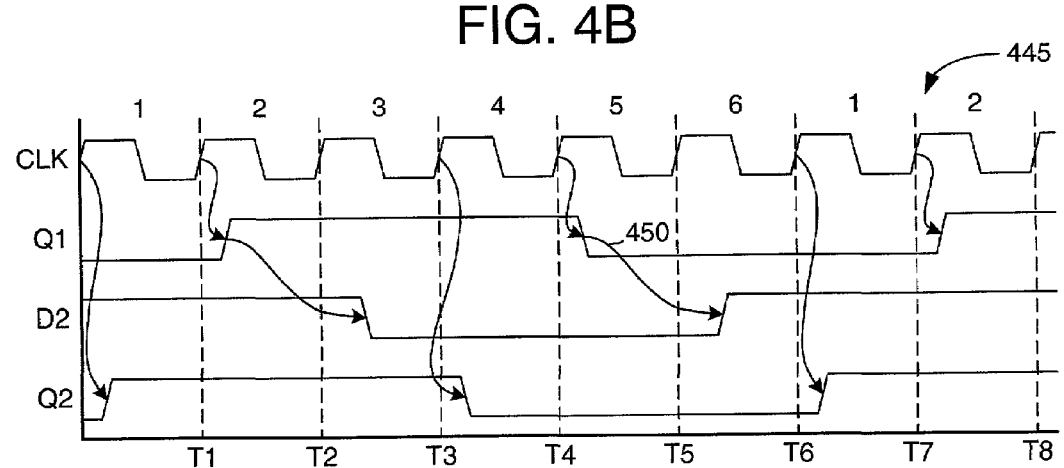
FIG. 4C is a timing diagram 445 depicting the operation of circuit 300 of FIG. 3 when both rising and falling edges from flip-flop 310 fail to latch into flip-flop 315 within a single clock cycle.

FIG. 4C depicts a timing diagram 445 depicting the operation of circuit 300 of FIG. 3 when both rising and falling edges from flip-flop 310 fail to latch into flip-flop 315 within a single clock cycle. Timing diagram 445 is similar to timing diagram 422 of FIG. 4B, except that falling edges on terminal Q2 fail to produce rising edges on input terminal D2 of flip-flop 315 within a single clock cycle (arrow 450). As a result of the late arrival of both rising and falling edges from output terminal Q1 to input terminal D2, the signal on terminal Q2 is two clock periods longer than the signal from counter 357 (i.e., six clock periods vs. four). In this case, a test period defined by fixed-width pulse generator 355 would result in counter 345 having four counts for every six counts in counter 350.

Clock generator 330 can be run at a desired speed to determine whether signal path 305 meets some minimum performance standard. Alternatively, the frequency produced by clock generator 330 can be adjusted across a spectrum of frequencies to identify the frequency at which timing fails. In this way, signal path 305 can be analyzed to produce more accurate models of the delay-inducing portions of delay path 305.

The example of FIG. 3 assumes the feedback path between terminal Q2 and the D input of flip-flop 310 is faster than signal path 305. Otherwise, measured differences between the frequencies at terminal Q2 and clock terminal CLK might be due to the feedback path, and not to signal path 305. Circuit 300 may therefore provide erroneous data.

Figure 5:
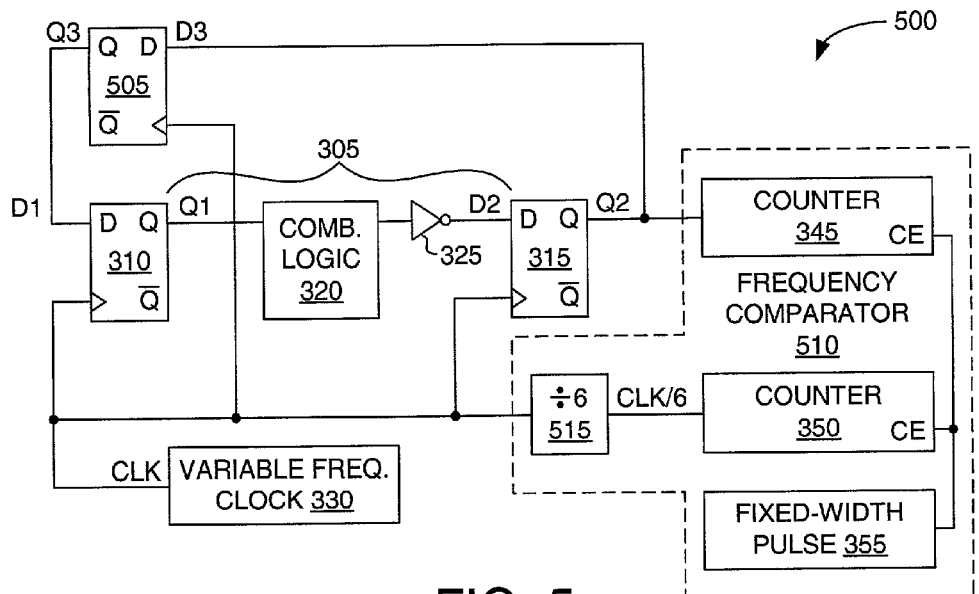
FIG. 5 depicts a test circuit 500 in accordance with an embodiment of the invention that addresses the potential problem of a relatively slow feedback path between output terminal Q2 of flip-flop 315 and the input terminal D of flip-flop 310.

FIG. 5 depicts a test circuit 500 in accordance with an embodiment of the invention that addresses the potential problem of a relatively slow feedback path between output terminal Q2 of flip-flop 315 and the input terminal D of flip-flop 310. Many components of circuit 500 are similar to components in FIG. 300 of FIG. 3, like-named elements being the same. In place of the direct feedback between output terminal Q2 and the input terminal of flip-flop 310, circuit 500 includes a flip-flop 505 clocked by the common clock line CLK. Thus configured, flip-flops 310, 315, 505, and the components that interconnect them form a divide-by-six counter. That is, the output signal on terminal Q2 will have a period of six clock cycles.

Like circuit 300, test circuit 500 includes a frequency comparator 510. In place of the divide-by-four counter 357, however, frequency comparator 510 includes a divide-by-six counter 515. Circuit 500 works in the same manner as circuit 300. Each of the feedback paths (Q2 to D3 and Q3 to D1) should be faster than signal path 305.

Figure 6:
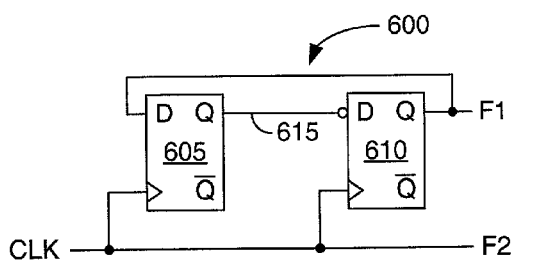
FIG. 6 depicts a test circuit in accordance with another embodiment of the invention.

FIG. 6 depicts a test circuit in accordance with another embodiment of the invention. Test circuit 600 includes a flip-flop 305, a flip-flop 610, and a path of interest 615 extending between them. Signal path 615 can be tested as described above in connection with FIG. 3 and FIGS. 4A–4C by comparing the output frequencies at terminals F1 and F2. Flip-flop 610 is similar to flip-flop 315 of FIG. 3, except flip-flop 610 is a conventional flip-flop that can be programmably set to include an inverting input, thus eliminating the need for inverter 325. Incidentally, in some cases combinatorial logic 320 will be inverting, which eliminates the need for either inverter 325 or the inverting input depicted in FIG. 6. Signal path 615 is depicted as a line for simplicity. It is to be understood that signal path 615 and other similar signal paths discussed herein may include additional delay-inducing components.

Figure 7:
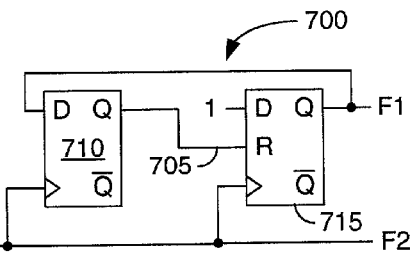
FIG. 7 depicts a test circuit 700 for testing a signal path 705 extending between a synchronous element 710 and a reset terminal of a second synchronous element 715.

FIG. 7 depicts a test circuit 700 for testing a signal path 705 extending between a synchronous element 710 and a reset terminal of a second synchronous element 715. The delay associated with path 705 can be tested in the manner described above by comparing the frequencies at terminals F1 and F2.

Figure 8:
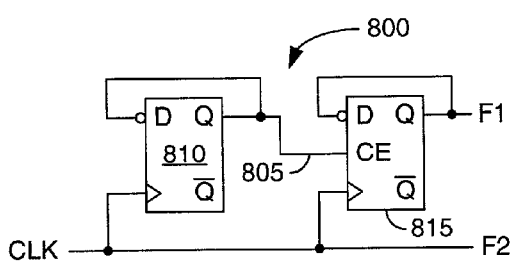
FIG. 8 depicts a test circuit 800 used to measure a signal path 805 extending between a synchronous output terminal of a flip-flop 810 and the enable terminal CE of a second flip-flop 815.

FIG. 8 depicts a test circuit 800 used to measure a signal path 805 extending between a synchronous output terminal of a flip-flop 810 and the enable terminal CE of a second flip-flop 815. The delay associated with path 805 can be tested in the manner described above by comparing the frequencies at terminals F1 and F2.

Figure 9:
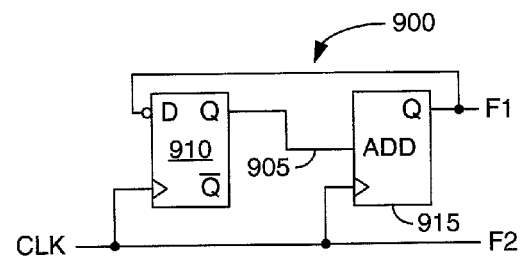
FIG. 9 depicts a test circuit 900 adapted in accordance with another embodiment of the invention to measure the delay associated with signal path 905 extending between the synchronous output terminal of a flip-flop 910 and an address terminal of a RAM element 915.

FIG. 9 depicts a test circuit 900 adapted in accordance with another embodiment of the invention to measure the delay associated with signal path 905 extending between the synchronous output terminal of a flip-flop 910 and an address terminal of a RAM element 915. Test circuit 900 performs a divide-by-four counter when RAM element 915 a logic zero at address zero and a logic one at address one. The delay associated with path 905 can be tested in the manner described above by comparing the frequencies at terminals F1 and F2.

While the present invention has been described in connection with specific embodiments, variations of these embodiments will be obvious to those of ordinary skill in the art. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A test circuit for measuring the signal propagation delay through a signal path, the test circuit comprising:
    a clock generator for providing a clock signal to a circuit under test providing the signal path, the clock signal having a predetermined frequency; and
    a comparator coupled to receive the clock signal from the clock generator and to an output of the signal path, the comparator receiving the clock signal and a signal at the output of the signal path to measure a delay of the signal path through the circuit under test, the comparator including,
        a divider having a predetermined dividing function, the divider receiving the clock signal and dividing the clock signal by the predetermined dividing function;
        a first counter, coupled to the output of the signal path, the first counter counting the number of pulses in the signal at the output of the signal path;
        a second counter, coupled to the divider, for counting the number of pulses at the output of the divider; and
        a pulse generator, coupled to the first and second counters, for enabling the first and second counters, wherein the ratio between the number of counts in the first counter and the second counter identifies the delay through the signal path.

2. The test circuit of claim 1, wherein the clock signal comprises a variable frequency clock signal.

3. The test circuit of claim 1, wherein a number of counts in the first counter is less than a number of counts in the second counter, thereby indicating too much delay in the signal path.

4. The test circuit of claim 1, wherein the circuit under test comprises:
    a first synchronous memory element having a synchronous first input terminal, a synchronous first output terminal, and a first clock terminal coupled to receive the clock signal; and a second synchronous memory element having a second input terminal coupled to the first synchronous output terminal via the signal path, a synchronous second output terminal, and a second clock terminal coupled to receive the clock signal.

5. The test circuit of claim 4, wherein the second input terminal is synchronous.

6. The test circuit of claim 4, wherein the circuit under test further includes combinatorial logic.

7. The test circuit of claim 4, wherein the second synchronous memory element comprises a RAM element.

8. The test circuit of claim 4, further comprising a third synchronous memory element coupled between the synchronous second output terminal and the synchronous first input terminal.

9. A method of measuring a signal propagation delay of a signal path defined between first and second synchronous memory elements on a programmable logic device, the method comprising:

provinding a clock signal to a circuit under test providing the signal path, the clock signal having a predetermined frequency;

receiving the clock signal and a signal at an output of the signal path;

dividing the clock signal by a predetermined dividing function to provide a divided clock signal;

counting a number of pulses in the signal at the output of the signal path;

counting a number of pulses in the divided clock signal; and comparing the number of pulses in the signal at the output of the signal path to the number of pulses in the divided clock signal to identify the signal propagation delay.

10. A test circuit for measuring the signal propagation delay through a signal path, the test circuit comprising:

means for providing a clock signal to a circuit under test providing the signal path, the clock signal having a predetermined frequency;

means for providing a data signal to the signal path;

means for counting a number of pulses in the data signal at an output of the signal path;

means for dividing the clock signal by a predetermined dividing function to provide a divided clock signal;

means for counting a number of pulses in the divided clock signal; and means for comparing the number of pulses in the data signal to the number of pulses in the divided clock signal to measure the signal propagation delay.

11. A delay verification circuit, comprising:

a first divider coupled to receive a data signal and a clock signal, the first divider being adapted to provide a first divided signal in response to rising edge transitions of the clock signal;

a test circuit coupled to receive the first divided signal and adapted to propagate the first divided signal from an input to an output of the test circuit, wherein a delay is the time required to propagate the first divided signal from the input to the output of the test circuit;

a second divider coupled to receive the clock signal and coupled to receive the first divided signal from the test circuit, the second divider being adapted to provide a second divided signal in response to rising edge transitions of the clock signal;

a first counter coupled to receive the second divided signal and adapted to provide a first count, the first count being a number of rising edge transitions in the second divided signal during a test period; and a second counter coupled to receive a divided clock signal and adapted to provide a second count, the second count being a number of rising edge transitions in the divided clock signal during the test period, wherein the delay is verified if the first and second counts are equal.

12. The delay verification circuit of claim 11, further comprising a third divider coupled to receive the clock signal and adapted to provide the divided clock signal to the second counter, wherein a divisor of the third divider equals a sum of divisors of the first and second dividers.

13. The delay verification circuit of claim 12, further comprising a fourth divider coupled to receive the second divided signal and further coupled to receive the clock signal, the fourth divider being adapted to provide the data signal to the first divider, wherein a divisor of the third divider equals the sum of divisors of the first, second, and fourth dividers.

14. The delay verification circuit of claim 11, further comprising a pulse generator coupled to the first and second counters and adapted to enable the first and second counters to establish the test period.

15. The delay verification circuit of claim 11, wherein the delay is not verified if the first and second counts are unequal.

* * * * *